US009378795B1

(12) United States Patent
DeBrosse

(10) Patent No.: US 9,378,795 B1
(45) Date of Patent: *Jun. 28, 2016

(54) MISMATCH AND NOISE INSENSITIVE SENSE AMPLIFIER CIRCUIT FOR STT MRAM

(71) Applicant: International Business Machines Corporation, Armonk, NY (US)

(72) Inventor: John K. DeBrosse, Colchester, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/749,167

(22) Filed: Jun. 24, 2015

Related U.S. Application Data

(63) Continuation of application No. 14/629,875, filed on Feb. 24, 2015.

(51) Int. Cl.
- *G11C 5/08* (2006.01)
- *G11C 11/16* (2006.01)
- *G11C 7/06* (2006.01)
- *G11C 7/02* (2006.01)

(52) U.S. Cl.
CPC ............ *G11C 11/1673* (2013.01); *G11C 7/02* (2013.01); *G11C 7/06* (2013.01); *G11C 11/16* (2013.01); *G11C 11/1653* (2013.01)

(58) Field of Classification Search
CPC .......... G11C 11/16; G11C 7/06; G11C 7/067; G11C 16/0483; G11C 2207/063
USPC ................... 365/66, 185.19, 206, 208, 210.1, 365/185.09; 327/51, 52, 53, 56
See application file for complete search history.

(56) References Cited

U.S. PATENT DOCUMENTS

| 5,508,958 A * | 4/1996 | Fazio ................. G11C 11/5621 365/168 |
| 7,701,763 B2 * | 4/2010 | Roohparvar ......... G11C 27/005 365/185.09 |
| 2004/0120200 A1 * | 6/2004 | Gogl ..................... G11C 7/067 365/210.1 |

OTHER PUBLICATIONS

Anthony R. Bonaccio, et al.; "Offset-Cancelling Self-Reference STT-MRAM Sense Amplifier"; U.S. Appl. No. 14/580,589, filed Dec. 23, 2014.
John DeBrosse, et al.; "STT-MRAM Sensing Technique"; U.S. Appl. No. 14/484,742, filed Sep. 12, 2014.
John K. Debrosse, et al.; "Mismatch and Noise Insensitive STT MRAM"; U.S. Appl. No. 14/629,875, filed Feb. 24, 2015.
List of IBM Patents or Patent Applications Treated as Related—Date Filed: Aug. 24; 1 page.
List of IBM Patents or Patent Applications Treated as Related—Date Filed: Nov. 30, 2015; 1 page.

* cited by examiner

*Primary Examiner* — Gene Auduong
(74) *Attorney, Agent, or Firm* — Cantor Colburn LLP; Vazken Alexanian

(57) ABSTRACT

A technique for sensing a data state of a data cell. A comparator has a first input at a node A and a second input at a node B. A first n-channel transistor is connected to a first p-channel transistor at the node A. A second n-channel transistor is connected to a second p-channel transistor at the node B. A multiplexer is configured to selectively connect a first reference cell or the data cell to the first n-channel transistor and configured to selectively connect the data cell or a second reference cell to the second re-channel transistor. The comparator outputs the data state of the data cell based on input of a node A voltage at the node A and a node B voltage at the node B.

9 Claims, 10 Drawing Sheets

US 9,378,795 B1

MISMATCH AND NOISE INSENSITIVE SENSE AMPLIFIER CIRCUIT FOR STT MRAM

DOMESTIC PRIORITY

This application is a continuation of U.S. patent application Ser. No. 14/629,875, filed Feb. 24, 2015, the disclosure of which is incorporated by reference herein in its entirety.

BACKGROUND

The present disclosure relates generally to electronic memory technology, and more specifically to mismatch and noise insensitive spin torque transfer magnetic random access memory (STT-MRAM).

STT MRAM is an attractive emerging memory technology, offering non-volatility, high performance and high endurance. A typical STT MRAM memory cell includes a magnetic tunnel junction (MTJ) in series with a field effect transistor (FET), which is gated by a word line (WL). A bitline (BL) and a source line (SL) run parallel to each other and perpendicular to the WL. The BL is connected to the MTJ, and the SL is connected to the FET. One memory cell along the BL is selected by turning on its WL. When a relatively large voltage (e.g., 500 mV) is forced across the cell from BL to SL, the selected cell's MTJ is written into a particular state, which is determined by the polarity of this voltage (BL high vs. SL high).

When the cell is in a logic zero (0) or parallel state, its MTJ resistance is lower than when the cell is in a logic one (1) or anti-parallel state. Typical MTJ resistance values would include $R_0=10$ K$\Omega$ and $R_1=20$ K$\Omega$. A selected cell is read by sensing the resistance from BL to SL. The "sense" or "read" voltage must be much lower than the write voltage in order to clearly distinguish write and read operations, and to avoid inadvertently disturbing the cell during a read operation. Thus, sensing methodologies must be capable of accurately sensing very low read voltage (e.g., less than 50 mV). The state-dependent change in resistance is characterized by the parameter MR or magnetoresistance, which is defined as $MR=(R1-R0)/R0$. 100% is a typical nominal value for MR, although higher values have been reported.

BRIEF SUMMARY

Embodiments include a system for sensing a data state of a data cell. The system includes a comparator having a first input at a node A and a second input at a node B, a first n-channel transistor connected to a first p-channel transistor at the node A, and a second n-channel transistor connected to a second p-channel transistor at the node B. A multiplexer is configured to selectively connect a first reference cell or the data cell to the first n-channel transistor and configured to selectively connect the data cell or a second reference cell to the second n-channel transistor. The comparator outputs the data state of the data cell based on input of a node A voltage at the node A and a node B voltage at the node B.

Embodiments include a method for sensing a data state of a data cell. A comparator having a first input at a node A and a second input at a node B is provided. An output of the comparator is based on the node A and the node B. A first n-channel transistor is connected to a first p-channel transistor at the node A. A second n-channel transistor is connected to a second p-channel transistor at the node B. A multiplexer is configured to selectively connect a first reference cell or the data cell to the first re-channel transistor and configured to selectively connect the data cell or a second reference cell to the second n-channel transistor. The comparator outputs the data state of the data cell based on input of a node A voltage at the node A and a node B voltage at the node B.

Embodiments include a method for sensing a data state of a data cell. A node A voltage is provided at a node A, such that the node A voltage is based on a first reference cell current minus a data cell current. A node B voltage is provided at a node B, such that the node B voltage is based on the data cell current minus a second reference cell current. A comparator has a first input at the node A and a second input at the node B. At the node A, a first n-channel transistor is connected to a first p-channel transistor. At the node B, a second n-channel transistor is connected to a second p-channel transistor. A multiplexer is configured to selectively connect a first reference cell or the data cell to the first n-channel transistor and configured to selectively connect the data cell or a second reference cell to the second n-channel transistor. The comparator outputs the data state of the data cell based on a differential voltage between the node A voltage and the node B voltage.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

Figure 1:
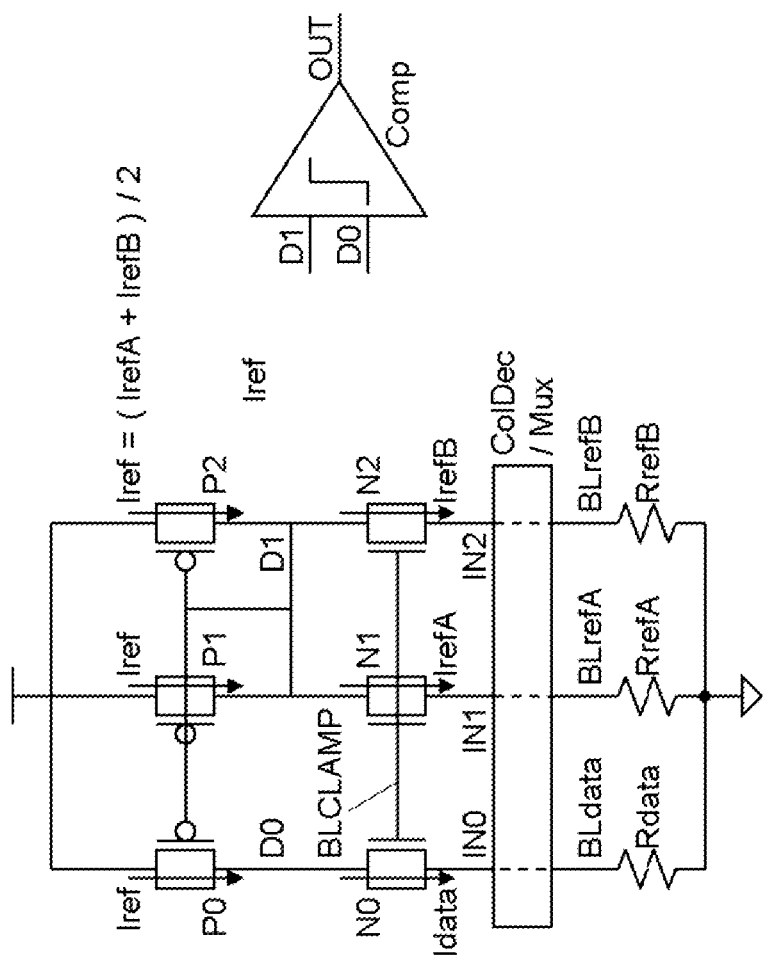
FIG. 1 illustrates a schematic of an MRAM sense amplifier technique.

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

Various embodiments of the present disclosure will now be described with reference to the related drawings. Alternate embodiments may be devised without departing from the scope of this disclosure. It is noted that various connections are set forth between elements in the following description and in the drawings. These connections, unless specified otherwise, may be direct or indirect, and the present disclosure is not intended to be limiting in this respect. Accordingly, a coupling of entities may refer to either a direct or an indirect connection.

The design of a sense amplifier (SA) for STT MRAM in advanced node technologies may be very challenging for a variety of reasons:

1. The sensed resistance ratio between 1 and 0 state cells is lower than MR would imply due to the series resistance of the array field effect transistor (FET), BL, SL and column decoder (CD).

2. Local variation in magnetic tunnel junction (MTJ) resistance degrades read margin.

3. Local variation in the electrical parameters of FETs, known as FET mismatch, results in random offsets within the SA, further degrading read margin.

4. FET mismatch also results in variation in the forced read voltage, decreasing the available signal or increasing the probability of read disturbs.

5. Transient noise on the supply or any references to the SA further degrade read margin.

6. Since the STT MRAM cell has exactly two states, it is necessary to average two reference cells (one of either state) to create a midpoint reference.

7. As silicon technology scales, conventional analog circuit techniques become impractical, due to a lack of power supply headroom and limitations on the use of long channel devices.

8. As silicon technology scales, the sensitivity to FET mismatch generally increases.

9. For many applications, the sense amplifier power and area are severely constrained.

FIG. 1 illustrates a circuit 100 for a state-of-the-art MRAM sense amplifier technique, in which the data cell current is compared to the average of two reference cell currents, one of either state. In FIG. 1 and subsequent figures, BL side sensing is assumed, and the array FET and SL side circuitry are omitted for brevity and clarity. An NFET (negative channel FET) source follower circuit clamps the three bitlines (or SLs depending on the preferred read polarity) to the target read voltage. The difference between the data cell current and the average of the two reference cell currents is converted to a voltage difference by a PFET (positive channel FET) current mirror load circuit, which in turn is sensed by a comparator to produce the digital SA output. FIG. 1 describes a 3-legged version (1 data+2 references). Additionally, there may be a second data leg added to the structure, creating a 4-legged version (2 data+2 references) which may somewhat improve the symmetry of the circuit 100.

Because the PFET mirror load gate capacitance appears only on the reference side, the circuit is not perfectly symmetric between the data and reference sides. Nonetheless, the circuit has good symmetry, which in turn provides good immunity to transient noise, on the supply node or on the NFET BL clamp gate node (BLCLAMP), for example. The primary shortcoming of this technique is its sensitivity to FET mismatch in the PFET current mirror load circuit, the NFET BL clamp, and the comparator, in order from most to least sensitive.

FET mismatch is a well-known and unavoidable phenomenon influencing the performance of analog circuits. Despite the use of layout techniques to minimize mismatch, any two seemingly identical FETs will have slightly different values of threshold voltage and transconductance due to local variations in device dimensions, gate oxide thickness, channel doping, and other physical parameters. These mismatches result in finite random offsets in circuits which would otherwise have zero offset. Furthermore, as FET device technology scales, the FET overdrive voltage (Vgs−Vt) generally decreases, increasing the sensitivity to FET mismatch. Vgs=Vg−Vs.

In the case of an MRAM sense amplifier (SA), FET mismatch results in a degradation of read margin. The threshold data cell resistance (the data cell MTJ resistance at which the SA switches from an output of 0 to an output of 1) is moved from its ideal value. Note that there is a technique for trimming out the effects of FET mismatch in an MRAM SA (although not discussed in FIG. 1). In essence, trimming allows the threshold data cell resistance to be moved back to a near ideal value on a SA by SA basis. However, trimming requires significant test time and circuit area. Further, trimming does not correct for FET parameter shifts which occur after initial test and trimming of the part. Still further, trimming cannot correct for transient noise effects, which are random in nature with respect to time.

Figure 2:
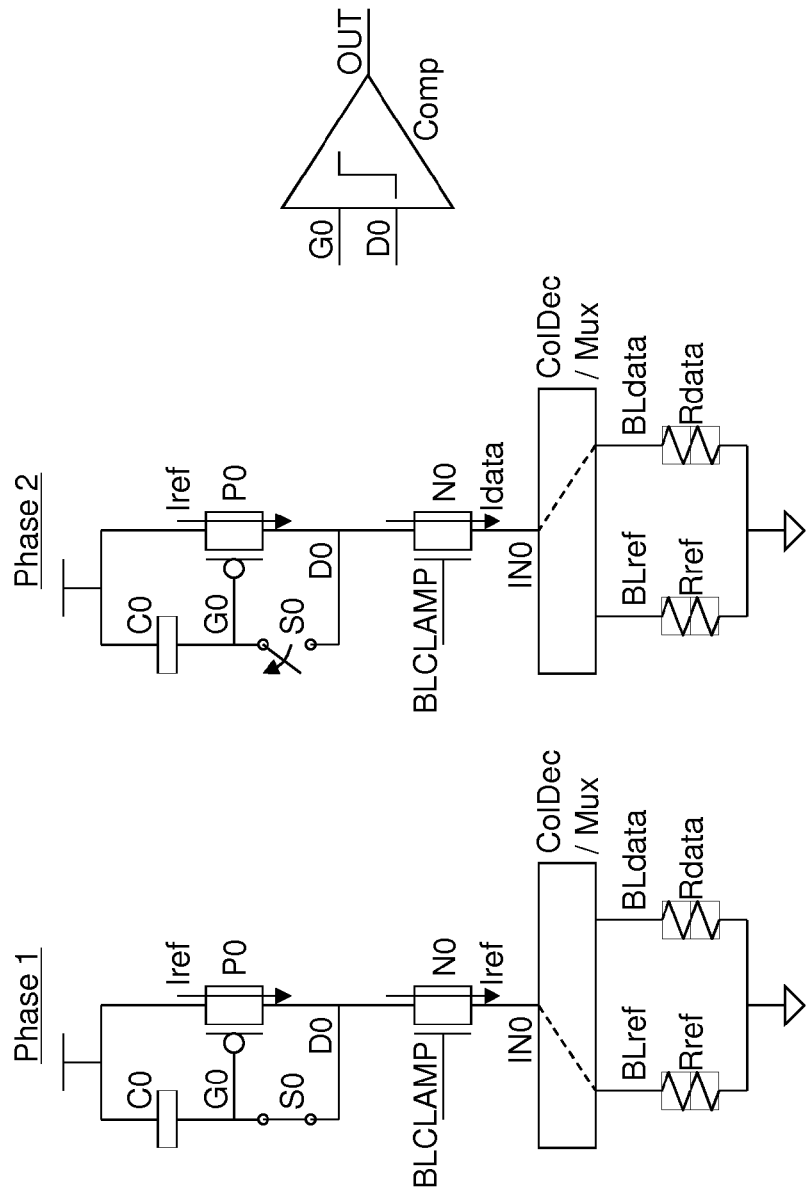
FIG. 2 illustrates a schematic of an MRAM sense amplifier technique.

FIG. 2 is a circuit 200 that attempts to address this issue by introducing a 2 phase, "sample and hold" technique, as illustrated. During the first phase (phase 1), the reference BL is clamped to the target read voltage by an NFET source follower similarly to the conventional method. The PFET load (P0) is configured as a diode (Vg=Vd) and the gate voltage corresponding to the reference cell current is stored on the capacitor. During the second phase (phase 2), the data BL is clamped to the target read voltage, and the PFET load is configured as a current source (Vg=Vphase1). The change in current between the two phases drives the drain node D0 high or low relative to the gate node G0. This voltage difference is fed to the comparator (comp), which produces the digital SA output.

This technique has the feature of being almost entirely insensitive to FET mismatch, as there are no matched device pairs in the signal path prior to the comparator, and the signal has been significantly amplified by this point. However, the technique is very sensitive to transient noise on the supply node or the NFET BL clamp gate node (BLCLAMP). As a 1-legged design, it is insensitive to FET mismatch but has no data/reference symmetry, making it very sensitive to transient noise. Perhaps more significantly, the design does not readily accommodate the averaging of two reference cells (one of either state). Using the circuit 200 in FIG. 2, this problem is solved by shorting 32 adjacent SA input nodes (16 of either state) together during the first, reference phase. Unfortunately, this design choice exposes the SA to FET mismatch, as the voltage stored on the capacitor C0 at the close of the reference phase is dependent on the FET parameters of the 32 shorted SAs whereas the data phase involves only one SA. This effectively negates the beneficial feature of this technique: its insensitivity to FET mismatch.

Figure 3:
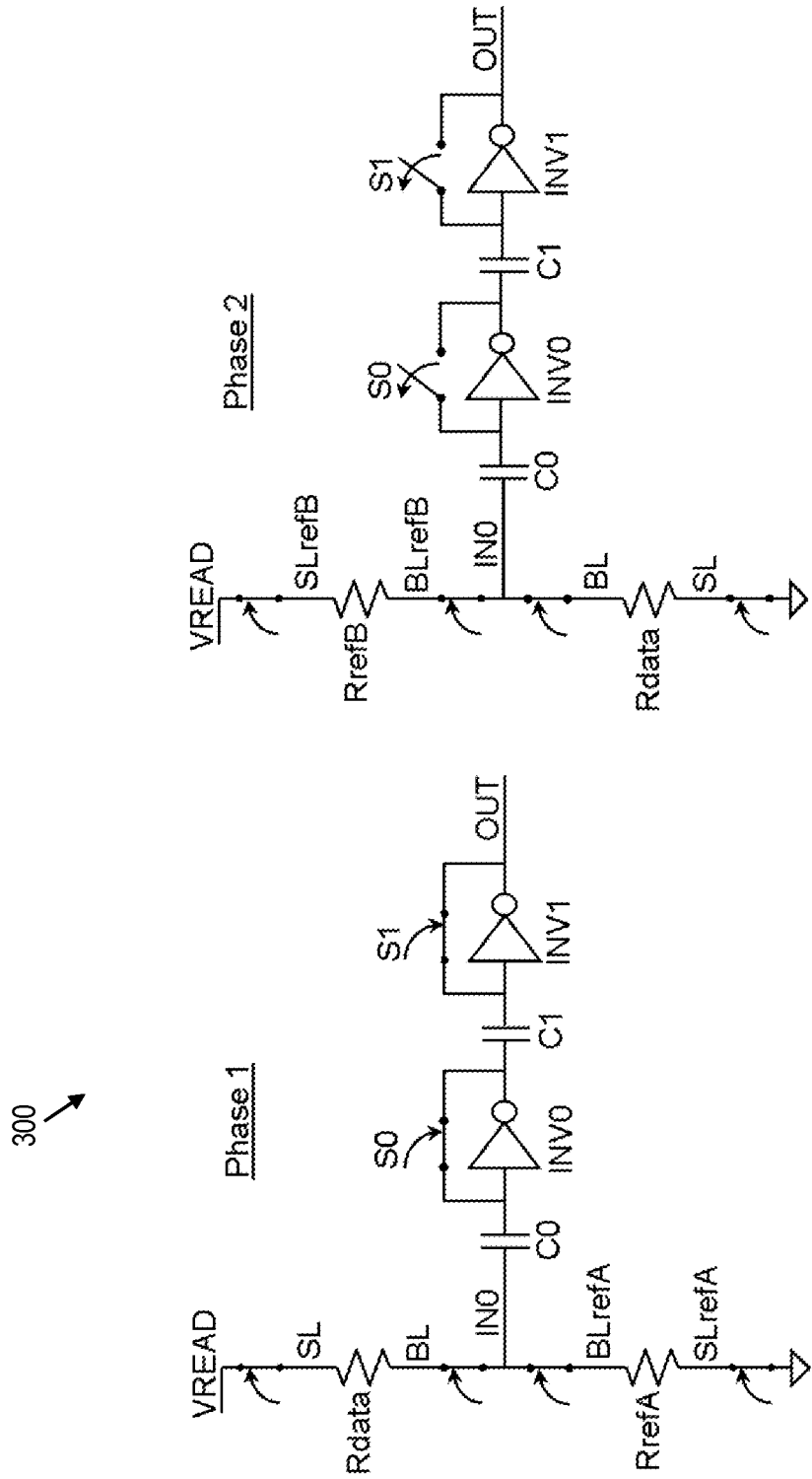
FIG. 3 illustrates a schematic of an sense amplifier technique.

FIG. 3 is a circuit 300 that attempts to address these issues with a 2 phase, sample and hold, "capacitively-coupled" voltage sensing technique, which is inherently insensitive to FET mismatch. The voltage input to this SA is created using a resistor divider configuration of the data cell and reference cell A during phase 1, and reference cell B and the data cell during phase 2. This approach does allow for the averaging of two reference cells (one of either state). However, similar to FIG. 2, the lack of data/reference symmetry in FIG. 3 makes it sensitive to transient noise on the supply and read voltage node. In particular, a very low impedance voltage source is required to drive the read voltage node to prevent data pattern dependent transient noise from influencing the system.

An embodiment describes an improved STT MRAM sensing technique which is (largely) insensitive to FET mismatch, is insensitive transient noise, and allows for the averaging of two reference cells (one of either state). The state-of-the-art techniques and circuits do not satisfy all three of these requirements.

Figure 4A:
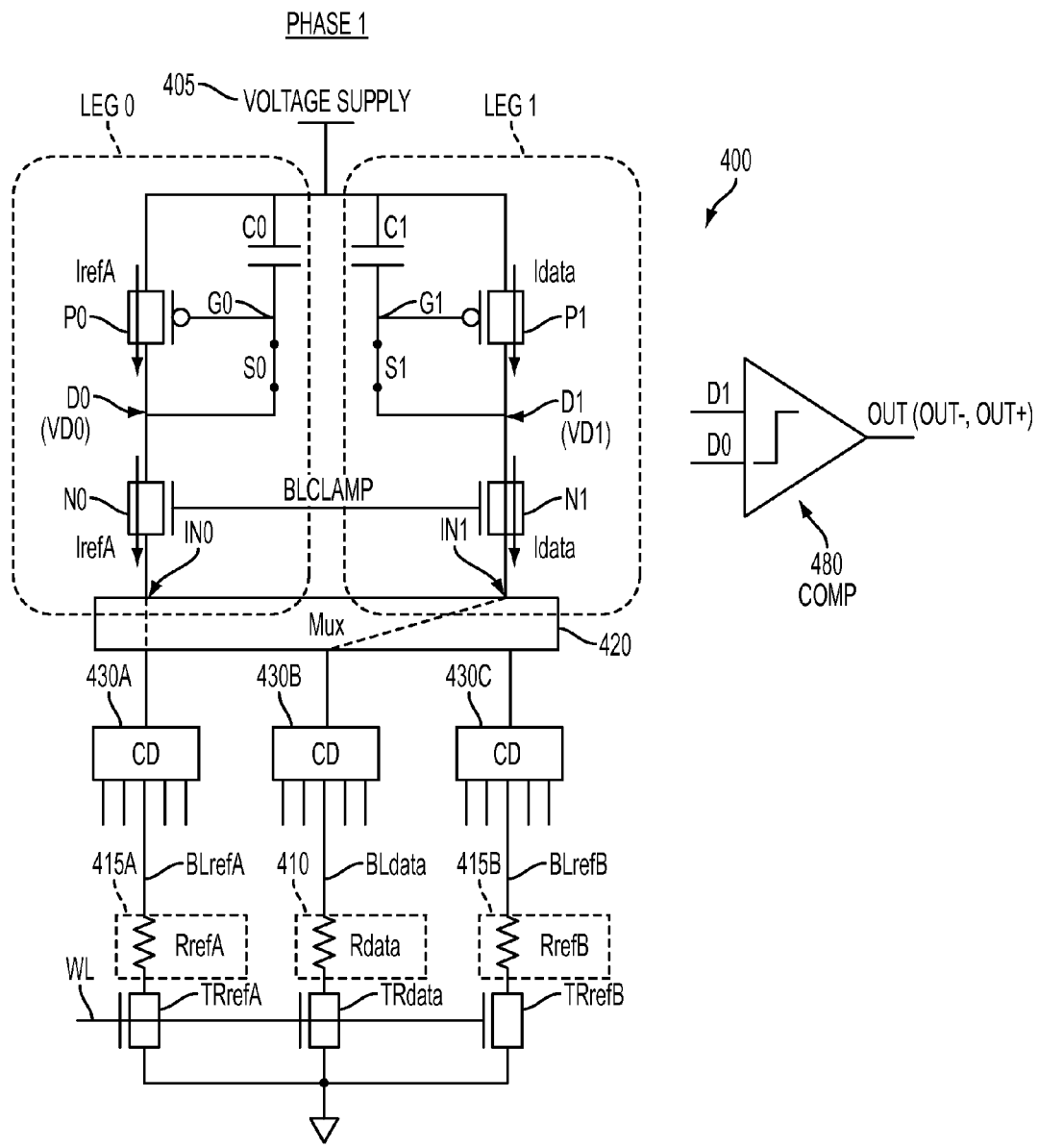
FIG. 4A illustrates a sense amplifier circuit for a mismatch and noise insensitive STT MRAM sensing technique (phase 1) according to an embodiment.
Figure 4B:
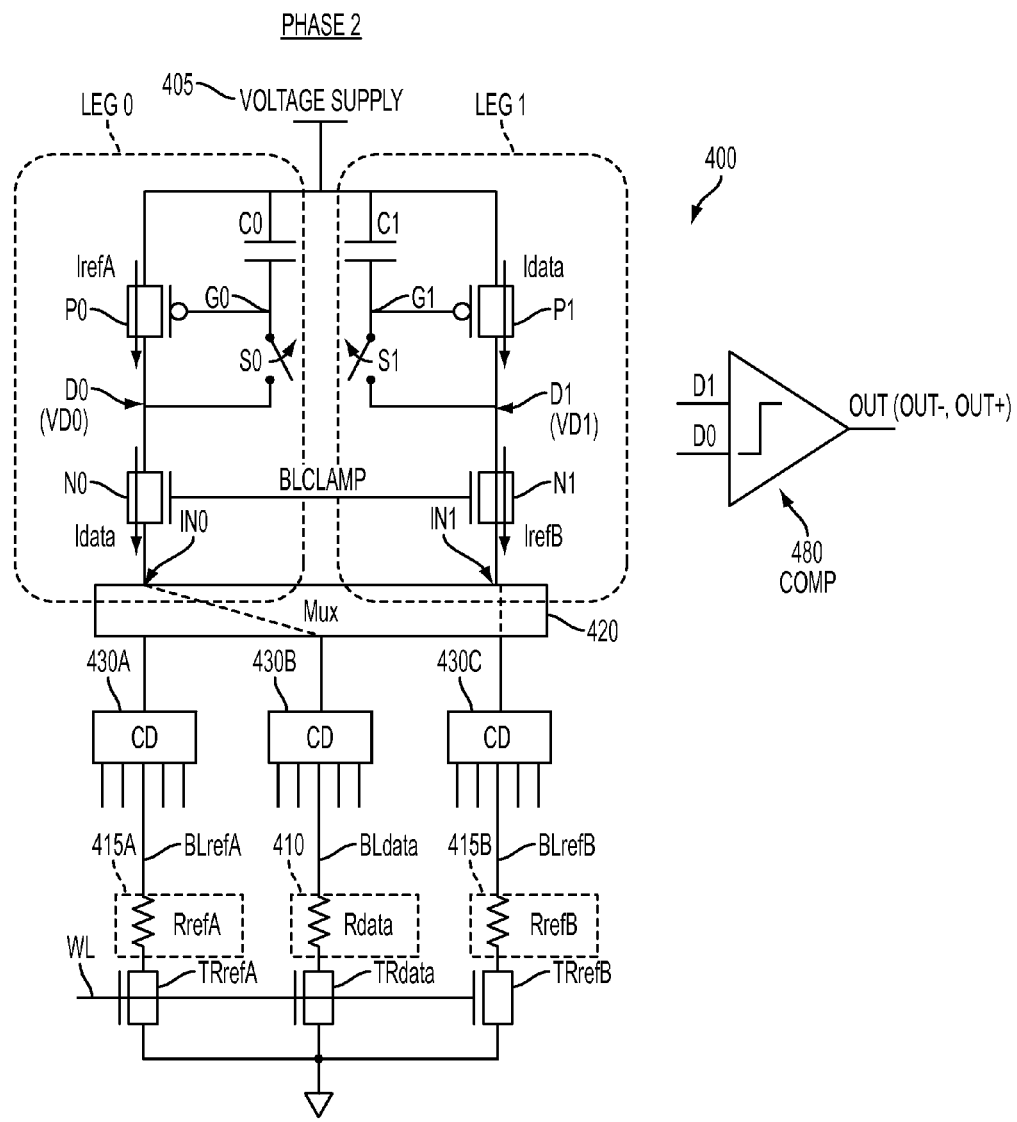
FIG. 4B illustrates the sense amplifier circuit for the mismatch and noise insensitive STT MRAM sensing technique (phase 2) according to an embodiment.

FIGS. 4A and 4B illustrate a sense amplifier (SA) circuit 400 for a mismatch and noise insensitive STT MRAM sensing technique according to an embodiment. FIG. 4A shows a Phase 1 configuration of the circuit 400 and FIG. 4B shows a Phase 2 configuration.

The SA MRAM circuit 400 is (completely) symmetric, with both halves (leg 0 and leg 1) consisting of an NFET (NFETs N0 and N1) source follower BL clamp in series with a PFET load device (PFETs P0 and P1), the gate of which is strongly coupled to the supply voltage node 405 by a capacitor and can be connected to its drain by way of a switch device or devices. For example, leg 0 is one half and leg 1 is the other half.

The leg 0 includes a PFET P0, capacitor C0, switch S0, and NFET N0. The PFET P0 has its source connected to the voltage supply node 405 and its drain (at node D0) connected to both switch S0 and the source of the NFET N0. The gate of the PFET P0 (at node G0) is connected to one end of the switch S0 and the capacitor C0. The other end of the capacitor C0 is connected to the voltage supply node 405. The gate of the NFET N0 is connected to BLCLAMP node, and the drain of the NFET N0 connects to one input IN0 of a multiplexer (Mux) 420.

The leg 1 includes a PFET P1, capacitor C1, switch S1, and NFET N1. The PFET P1 has its source connected to the voltage supply node 405 and its drain (at node D1) connected to both switch S1 and the source of the NFET N1. The gate of the PFET P1 (at node G1) is connected to one end of the switch S1 and the capacitor C1. The other end of the capacitor C1 is connected to the voltage supply node 405. The gate of the NFET N1 is connected to BLCLAMP node, and the drain of the NFET N1 connects to one input IN1 of the multiplexer (Mux) 420.

Both leg 0 and leg 1 feed into the multiplexer 420. The IN0 in leg 0 is one SA input, and the IN1 in leg 1 is one SA input. The two legs 0 and 1 are symmetric, which means that the exact same elements and connections occur in each leg. Symmetry in the circuit structure of the data and reference legs is a circuit technique understood by one skilled in the art, providing immunity to transient noise and commonly known as common mode noise rejection. By contrast, the techniques of FIGS. 2 and 3 lack physical circuit symmetry between data and reference, resulting in high sensitivity to transient noise for these techniques.

The SA circuit 400 includes STT MRAM data cell 410 (memory cell) (Rdata), reference cell A 415A (RrefA), and reference cell B 415B (RrefB). Each of the two SA inputs (IN0 in leg 0, and IN1 in leg 1) can be connected selectively to the data cell 410 or either to a reference cell (IN0 to reference cell A 415A, IN1 to reference cell B 415B). This multiplexing operation by the multiplexer (Mux) 420 typically involves the column decoders (CD) 430A, 430B, 430C, although other architectures are possible. The column decoder determines which bitline (i.e., column) to select.

Figure 5:
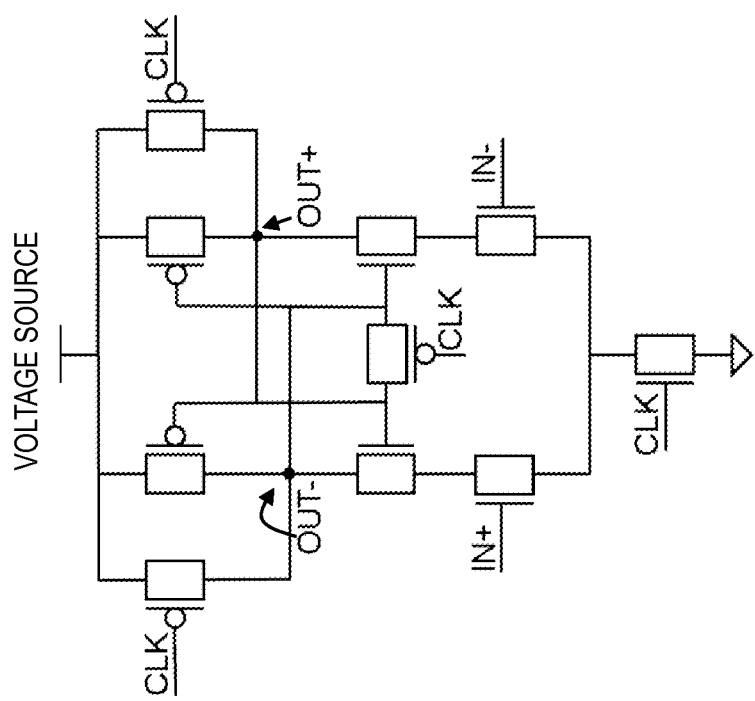
FIG. 5 illustrates a latch-style comparator that can be utilized with the sense amplifier circuit in FIGS. 4A and 4B.

Additionally, the drain nodes D0 and D1 of the two half-SAs (i.e., leg 0 and leg 1) are fed to a comparator 480, which produces the digital sense amplifier (SA) output. The digital SA output indicates that data state (high or low) of the MRAM data cell 410. Many comparator designs exist and could be utilized. As an example, the well-known, latch-style comparator shown in FIG. 5 is a good candidate for this application and maintains the perfect symmetry of the design.

During the first phase (phase 1), the data cell 410 is connected to one of the two SA inputs (IN1 in this case) and one of the two reference cells A or B is connected to the other (e.g., Ref cell 415A is connected to input IN0). The circuit 400 is allowed to stabilize, and then the two switches S0 and S1 are opened.

During the second phase (phase 2), the data cell 410 is connected to the other SA input (IN0 in this case) and the other reference cell B is connected to the original SA input (e.g., Ref cell 415B is connected to input IN1 in this case). The circuit 400 is again allowed to stabilize, and then the output is latched (stored) via the comparator 480, completing the read operation.

This design in FIG. 4 has good sensitivity to FET mismatch. Additionally, it may still be possible to trim the SA circuit 400, particularly at very advanced nodes. This can be achieved by adding small devices in parallel with the PFET load devices (i.e., in parallel with the PFETs P0 and P1), or by other methods.

Now turning to the details of circuit 400 in FIG. 4, the symmetry of each leg 0 and 1 shows the voltage supply 405 connected to the source of both PFETs P0 and P1 and to capacitors C0 and C1. At node G0, the gate of the PFET P0 is connected to the other end of capacitor C0 and to switch S0. At node G1, the gate of the PFET P1 is connected to the other end of capacitor C1 and to switch S1.

At node D0, the drain of the PFET P0 is connected to the source of the NFET N0 and the other end of the switch S0. Similarly, at node D1, the drain of the PFET P1 is connected to the source of the NFET N1 and the other end of the switch S1. Additionally, the node D0 is connected to one input of the comparator 480 while the node D1 is connected to the other input of the comparator 480. The voltages at node D0 and D1 are input into the comparator 480, and the output of the comparator 480 is the answer to whether the STT MRAM data cell 410 is a logic 0 or logic 1.

In the circuit 400, the NFET N0 has its gate connected to the gate of the NFET N1 via BLCLAMP. NFETs N0 and N1 are biased as source followers. BLCLAMP is generated (by a voltage source not shown) such that the source nodes of N0 and N1 are driven to the target read voltage VREAD, almost entirely independent of their impedance to ground. The drain of the NFET N0 is connected to the input IN0 of the multiplexer (Mux) 420, and the drain of the NFET N1 is connected to the input IN1 of the multiplexer 420. Three outputs of the Mux 420 are individually connected to three different column decoders (CD) 430A, 430B, 430C.

Via bitline reference A (BLrefA), one output of the column decoder 430A connects to reference A memory cell 415A represented as resistor/resistance RrefA. Via bitline data cell (BLdata), one output of the column decoder 430B connects to the STT MRAM data cell 410 represented as resistor/resistance Rdata. Via bitline reference B (BLrefB), one output of the column decoder 430C connects to the reference B memory cell 415B represented as resistor/resistance RrefB.

The source of transistor TRrefA connects to the other end of the reference A memory cell 415A, and the source of the transistor TRdata connects to the other end of the STT MRAM data cell 410. Also, the source of transistor TRrefB connects to the other end of the reference B memory cell 415B. The gates of transistor TRrefA, TRdata, and TRrefB are each connected to the same word line (WL). The drains of transistor TRrefA, TRdata, and TRrefB are connected to ground.

Figure 6:
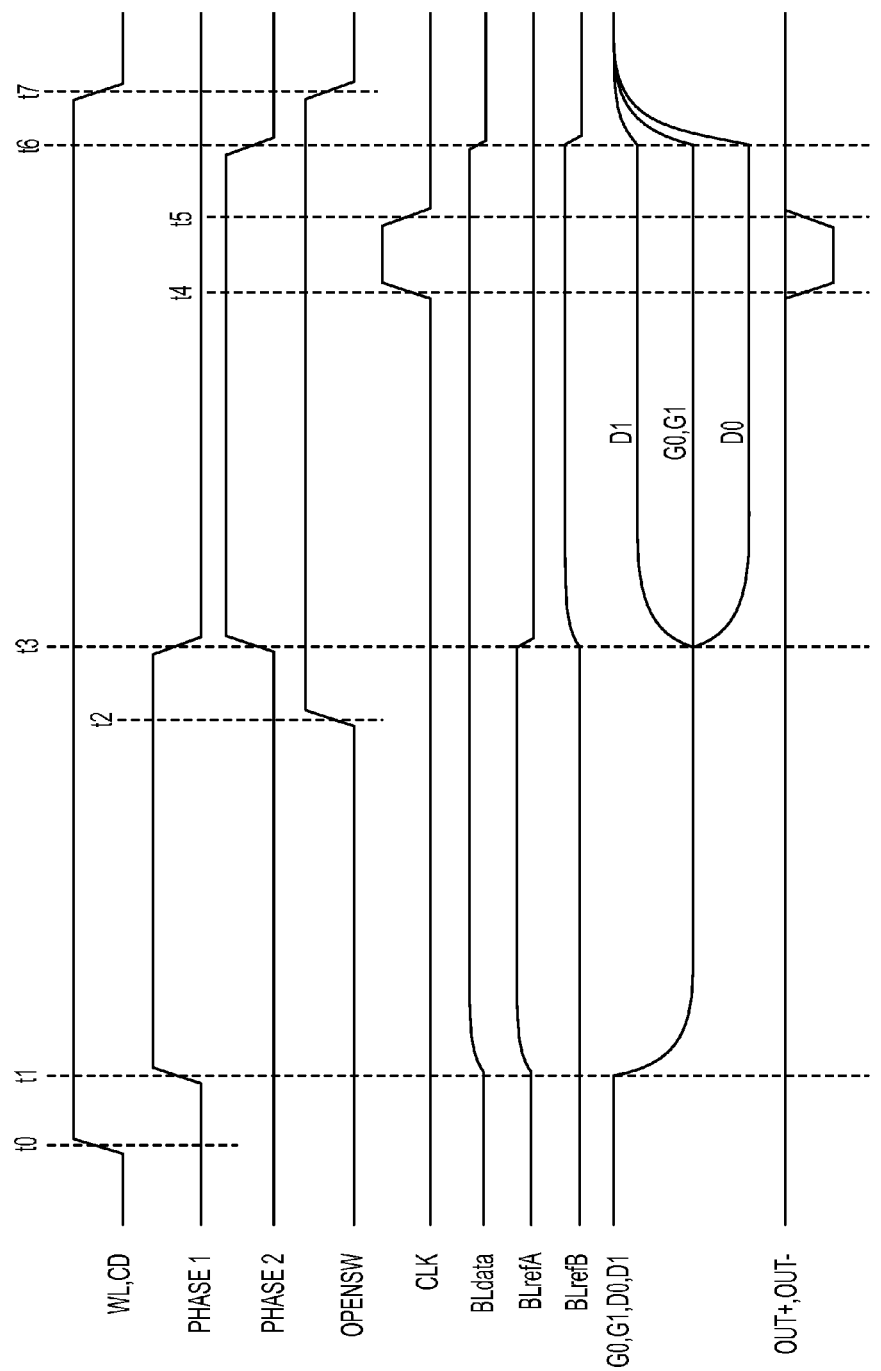
FIG. 6 illustrates an example timing diagram for the sense amplifier circuit in FIGS. 4A and 4B according to an embodiment.

According to an embodiment, FIG. 6 illustrates an example timing diagram 600 for the technique of the sense amplifier circuit 400 although other variations are possible. The timing diagram 600 shows the increase and decrease in voltage/current level for each element.

The sensing or read cycle begins at time t0 by enabling the word line (WL) and column decoder (CD) 430A-C such that low impedance paths are established from the SA Mux 420 to the selected data and reference cells (415A, 410, 415B) and onward to circuit ground. However, the SA Mux 420 is not yet enabled. No current flows in either leg 0 or 1 of the SA circuit 400, and hence nodes D0 and D1 float at an indeterminate voltage below voltage of the voltage supply 405.

Next, at time t1, the Phase 1 signal is asserted which enables the SA Mux 420 as illustrated in the phase 1 portion shown in FIG. 4A. That is, the reference A cell 415A is connected to NFET N0 via Mux input IN0, and the data cell 410 is connected to the NFET N1 via Mux input IN1. Electrical current begins to flow in both legs 0 and 1 of the SA circuit 400, and the reference A bitline (BLrefA) and the data bitline (BLdata) are both driven to the target read voltage (e.g., 50 mV in one case) by the NFET source followers N0 and N1. Thus far, the switch devices (S0, S1) have been closed, such that nodes D0 and G0 are shorted and such that nodes D1 and G1 are shorted. PFETs P0 and P1 are diode-connected (gate tied to drain), and nodes G0 and D0 and nodes G1 and D1 seek voltage levels which correspond to the cell currents (IrefA and Idata, respectively) flowing through PFETs P0 and P1. The voltage at gate-drain tied node G0/D0 may only be a few mV difference from gate-drain tied node G1/D1 at this time, which is why they appear as one line in FIG. 6.

Phase 1 stores voltages on C0 and C1 which include information about the data cell and reference A cell impedances, and about the device mismatches associated with this particular SA.

After the circuit 400 has stabilized, at time t2 the open switch signal (OPENSW) signal is asserted which opens the switch devices S0 and S1. At this point, PFETs P0 and P1 become current sources, each respectively driving the current which was flowing through it when the switches S0 and S1 were opened. The current is the reference cell A current (IrefA) for PFET P0 and the data cell current (Idata) for PFET P1.

Next, at time t3 the phase 1 signal is de-asserted and phase 2 signal is asserted. Asserting phase 2 reconfigures the SA Mux 420 as shown in the phase 2 portion of FIG. 4. At phase 2, the data cell 410 is connected to NFET N0 via input Mux IN0, and the reference cell B 415B is connected to the NFET N1 via input Mux IN1. Reference A bitline (for RrefA memory cell 415A) is allowed to discharge back to ground, while the data cell bitline BLdata (data (memory) cell 410) and the reference B bitline BLRrefB (memory cell 415B) are driven to the target read voltage (e.g., 50 mV in one case) by the NFET source followers N0 and N1. NFET N0 drives the data cell current (Idata) while NFET N1 drives the reference B cell current (IrefB) during phase 2.

The difference in current at node D0 between PFET P0 (IrefA) and NFET N0 (Idata) drives the voltage at node D0 up or down; this voltage at node D0 (VD0) can be approximated as (ron∥rop)*(IrefA−Idata). In the case for PFET P0 and NFET N0, VD0=(ron∥rop)*(IrefA−Idata), ron is the small-signal output impedance of NFET N0, rop is the small signal output impedance of PFET P0, and ron∥rop is the parallel calculation of (1/ron)+(1/rop).

The difference in current at node D1 between PFET P1 (Idata) and NFET N1 (IrefB) drives the voltage at node D1 up or down; this voltage at node D1 can be similarly approximated as (ron∥rop)*(Idata−IrefB). In the case for PFET P1 and NFET N1, VD1=(ron∥rop)*(IrefA−Idata), ron is the small-signal output impedance of NFET N1, rop is the small signal output impedance of PFET P1, and ron∥rop is the parallel calculation of (1/ron)+(1/rop).

It is noted that ron is the small-signal output impedance of NFET N0 or N1, corresponding to the voltage D0 or D1 that is being calculated. Also, it is noted that rop is the small signal output impedance of PFET P0 or P1, corresponding to the voltage D0 or D1 that is being calculated.

The (differential) voltage (Vcomp) at the two inputs of the comparator 480 can be approximated as follows:

$$Vcomp=VD1-VD0=(ron\|rop)*[(Idata-IrefB)-(IrefA-Idata)]$$

$$Vcomp=(ron\|rop)*[(2*Idata-IrefB-IrefA)]$$

$$Vcomp=2*(ron\|rop)*[Idata-(IrefB+IrefA)/2].$$

Hence the voltage at the input of the comparator 480 corresponds to the difference between the data cell current (Idata) and the average of the two references (average of IrefA and IrefB), as desired. Although analysis of the state-of-the-art system may seem to yield similar expression, the state-of-the-art system fails to provide the factor of 2 at the beginning equation for Vcomp as presented by the SA circuit 400. This doubling (factor 2) of the raw signal (for Vcomp) is one of the many strengths of this technique in the SA circuit 400. The data cell 410 is sensed during both phases (phase 1 and phase 2) in embodiments, as opposed to only during one phase in FIGS. 1 and 2, resulting in the factor of 2.

Once the SA circuit 400 has stabilized, from time t4 to t5 the CLK pulse is applied to the comparator 480 (assuming a comparator of the type illustrated in FIG. 5). One of the two comparator outputs (OUT+, OUT−) will fall to ground for the duration of the CLK pulse, which constitutes the digital output of the SA. OUT+ or OUT− will fall to ground, dependent on the relative voltages of nodes D0 and D1. This in turn determines the sensed state. These signals might be used to drive a set reset (SR) latch which would serve to store the most recent sensed data.

Now that the data (of the STT MRAM data cell 410) has been sensed, the SA circuit 400 must be returned to the standby state without disturbing the data cell 410. At time t6, the phase 2 signal is de-asserted, disabling the SA Mux 420 and allowing the bitlines (BLrefA, BLdata, BLrefB) to discharge to ground.

At time t7, the WL, CD and OPENSW signal are restored to their standby states, completing the cycle.

In the event that the data cell 410 is in the 1 or high resistance state, Idata (current) will be normally be less than or equal to IrefA and IrefB in FIG. 4B, resulting in node D1 being lower in voltage than node D0. This voltage difference is sensed by the comparator 480 to determine the output state (e.g., logic 1).

Figure 8:
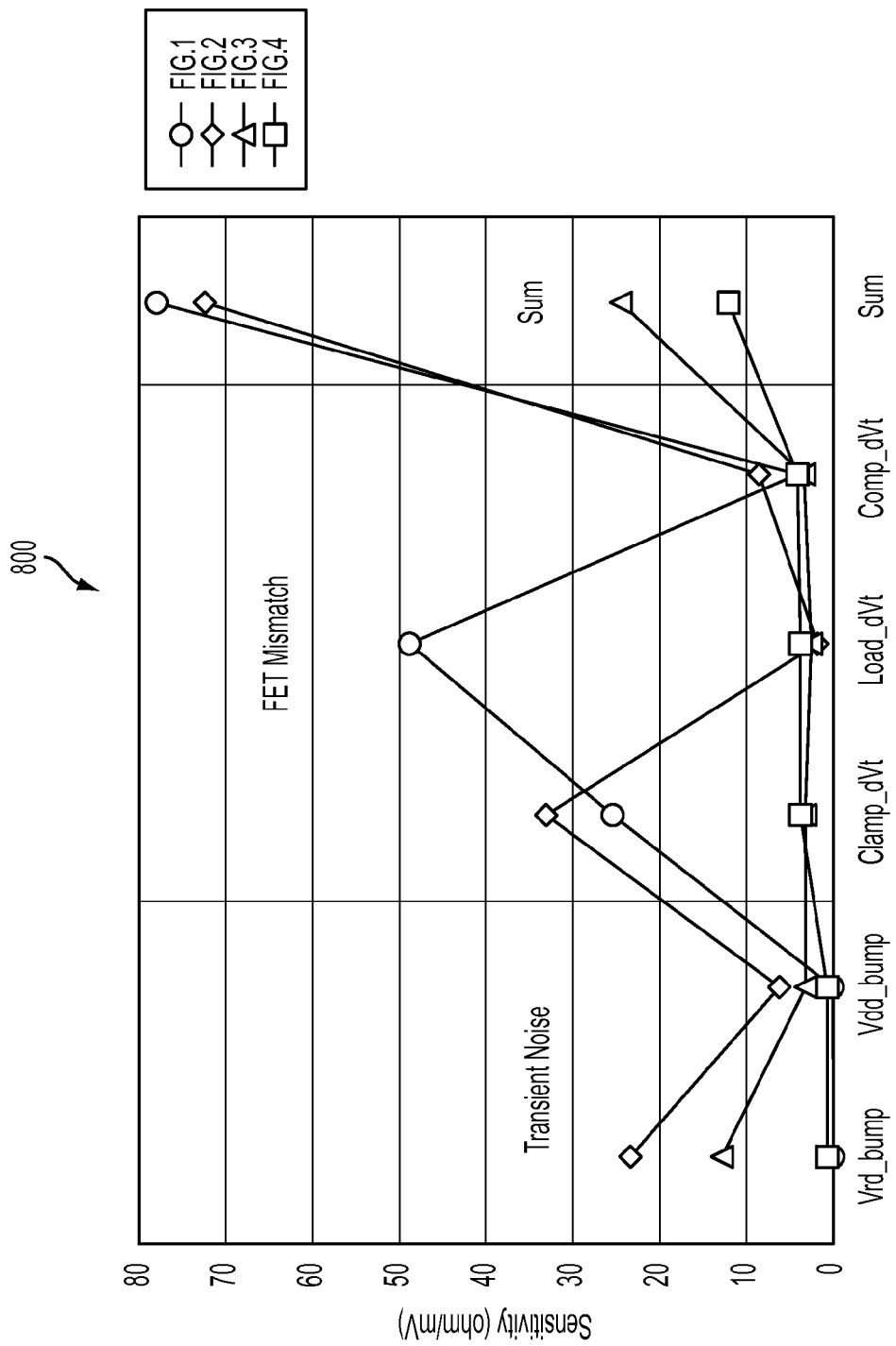
FIG. 8 illustrates a graph of simulation results from circuit simulation of the circuit in FIGS. 4A and 4B compared to other systems according to an embodiment.

FIG. 8 illustrates a graph 800 of simulation results from circuit simulation of the SA circuit 400 according to an embodiment. The graph 800 compares simulation results from the SA circuit 400 to state-of-the-art systems according to an embodiment.

The superior performance of the disclosed technique is demonstrated by circuit simulation using a representative set of assumptions. Assumptions include a technology node of 90 nm, R0 of 2 kilo-ohms (kΩ), and R1 of 4 kΩ, although similar results are expected for other relevant sets of assumptions. In this simulation, it is assumed that R0 is the low resistance of the MTJ (e.g., RrefA (data cell 410)) and R1 is the high resistance.

For each sensing technique, the sensitivity of the threshold data cell resistance to various noise and mismatch terms is determined. The threshold data cell resistance is the data cell MTJ resistance (e.g., data cell 410) at which the SA switches from an output of logic 0 to an output of logic 1. This value is roughly midway between the nominal values of R0 and R1. The optimum value is dependent on the distributions of R0 and R1. In addition to cancelling out the effect of FET mismatch, trimming allows the threshold data cell resistance to be set at the optimum value based on the R0 and R1 distributions.

However, any variation of the threshold data cell resistance in response to transient noise or to FET mismatch is undesirable as it degrades read margin. Though burdensome, trimming allows the impact of FET mismatch to be largely cancelled out. However, due to its random nature in time, the impact of transient noise cannot be cancelled out by trimming.

For each sensing technique, the sensitivity of the threshold data cell resistance to various noise and mismatch terms is determined. The units of this sensitivity are ohms (of the threshold data cell resistance) per mV (of transient noise or FET Vt mismatch). Transient noise is inserted on the read voltage reference to the SA (node BLCLAMP which connects the gates of the NFETS N0 and N1), and the resulting sensitivity is represented by Vrd_bump on the plot in graph 800. Similarly, transient noise on the SA (voltage) supply node is represented by Vdd_bump on the plot in the graph 800. The transient noise is applied just before the SA is set for the conventional technique and at the start of phase 2 for the others, both considered to be the worst case timing for transient noise. FET mismatch is represented by Vt mismatch in the NFET BL clamp devices and shown as Clamp_dVt on the plot in graph 800. The PFET load devices are represented as Load_dVt in graph 800, and NFET comparator input devices are represented as Comp_dVt in graph 800. These are the most mismatch-sensitive devices in the SA. Although not included for brevity, transconductance mismatch in these devices has a similar effect.

The state-of-the-art system in FIG. 3 uses a very different circuit architecture, making a direct comparison to the others somewhat difficult. However, VREAD (in the graph 800) is the read voltage reference to the SA in FIG. 3, analogous to BLCLAMP, and transient noise on this node is represented by Vrd_bump in graph 800. In fact, VREAD is probably more difficult to control, as the load on this node is of lower impedance and has a stronger data pattern dependence than that of BLCLAMP. Although the names are arbitrary in this case, FET mismatch in the NFET of the first stage (phase 1) is represented by Clamp_dVt (in graph 800), the PFET of the first stage is represented by Load_dVt (in graph 800), and the NFET of the second stage (phase 2) is represented by Comp_dVt (in graph 800). These are considered the most mismatch sensitive devices of this technique.

In addition to the individual sensitivities, the Sum of the individual sensitivities is presented. This is intended as a general figure of merit, as the individual noise and mismatch terms are almost certainly of different magnitude.

The graph 800 in FIG. 8 clearly illustrates the superior mismatch and noise insensitivity of the disclosed technique of the SA circuit 400.

The good symmetry of the state-of-the-art technique (in FIG. 1) provides good transient noise immunity. However, as well-known it is very sensitive to mismatch in the load, clamp, and comparator input devices, in order from most to least sensitive. While this technique has been used many times, it will be increasingly difficult to use at very advanced nodes as sensitivity to FET mismatch will increase.

The sample and hold technique (in FIG. 2) has high sensitivity to transient noise, particularly to that on the read voltage reference as there is no data/reference physical symmetry to the design and hence no common mode rejection. From simulations results not presented here, it is known that this technique is very insensitive to FET mismatch, except during the reference phase, when multiple SA input nodes are shorted together since the SA is incapable of averaging two reference cells by itself. For this reason, the technique is very sensitive to mismatch in the BL clamp device.

The capacitively-coupled technique (in FIG. 3) has good mismatch insensitivity, as expected for this technique. Careful design of the amplifying stages has minimized the supply transient sensitivity. However, the technique is inherently very sensitive to transient noise on the read voltage reference (VREAD). This is particularly distressing since the load on this node is of low impedance and has a strong data pattern dependence. Being random in time, the impact of this noise cannot be trimmed out.

Due to its perfect data/reference physical symmetry, the technique of this disclosure in SA circuit 400 of FIG. 4 is very immune to transient noise. Due to the 2 phase, sample and hold nature of the technique, circuit 400 also has excellent insensitivity to FET mismatch. From the graph 800, it can be seen that the sensitivity to mismatch is greater than that to transient noise. This is a beneficial feature, in that mismatch effects can be trimmed out whereas noise effects cannot. Lastly, this technique of circuit 400 easily accommodates the averaging of two reference cells (e.g., RrefA memory cell 415A and RrefB memory cell 415B).

An additional benefit of this technique in circuit 400 over that of FIG. 3 concerns sensing performance. For the technique of FIG. 3, the time constant governing the BL is the capacitance of the BL and any column decoder-related fanout capacitance times the cell resistance. For all of the other techniques discussed, the SA drives the BL to the target read voltage with an NFET source follower BL clamp circuit, whose small-signal or Thevenin equivalent resistance must be much lower than that of the cell for proper operation of the SA. Hence, the BL time constant is the same capacitance times this much lower impedance, resulting in faster development of the BL voltage. This phenomena is well-understood in memory design, as current sensing is generally considered faster than voltage sensing.

While technique of the circuit in FIG. 4 describes BL side sensing, the technique also supports (source line) SL side sensing.

Figure 7:
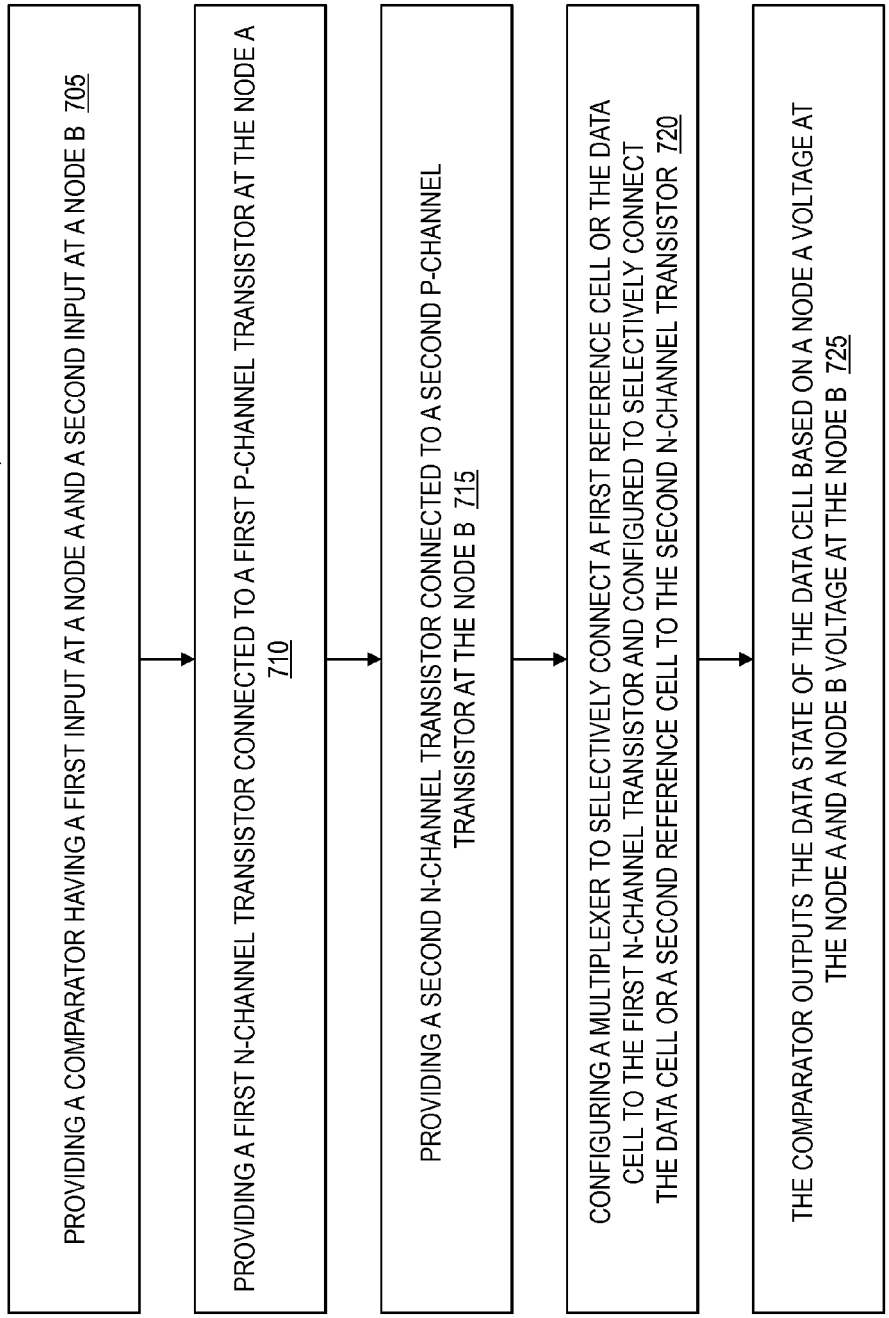
FIG. 7 is a method for sensing a data state of the data memory cell in the sense amplifier circuit according to an embodiment.

Now turning to FIG. 7, a method 700 for sensing a data state (e.g., high or low) of the data cell 410 in the STT MRAM sense amplifier circuit 400 according to an embodiment.

At block 705, the comparator 480 is configured with a first input at a node A (e.g., node D0) and a second input at a node B (e.g., node D1), such that the output of the comparator being based on the node A (node D0) and the node B (node D1).

At block 710, a first n-channel transistor (e.g., NFET N0) is connected to a first p-channel transistor (e.g., PFET P0) at the node A (node D0). At block 715, a second n-channel transistor (e.g., NFET N1) is connected to a second p-channel transistor (e.g., PFET P1) at the node B (node D1).

At block 720, the multiplexer 420 is configured to selectively connect a first reference cell A 415A (e.g., RrefA) (in phase 1) or the data cell 410 (Rdata) to the first n-channel transistor (NFET N0), and configured to selectively connect the data cell 410 (in phase 2) or the second reference cell B 415B to the second n-channel transistor (NFET N1). The first reference cell A 415A and the second reference cell B 415B are not both connected to the one of the NFETs N0 and N1 during the same phase.

At block 725, the comparator 480 outputs the data state of the data cell 410 based on the node A voltage (e.g., at node D0) and the node B voltage (e.g., at the node D1).

The column decoder 430A-430C connects the multiplexer 420 to the first reference cell A 415A, the second reference cell B 415B, and the data cell 410. In one embodiment, there may be a single column decoder instead of three separate column decoders 430A-C. In another embodiment, the multiplexer 420 and the single column decoder may be a single unit.

The voltage supply 405 is connected to the first p-channel transistor and the second p-channel transistor.

A first switch S0 selectively connects a drain (at node A (i.e., node D0)) of the first p-channel transistor PFET P0 to the voltage supply 405 via a first capacitor C0. A second switch S1 selectively connects a drain (at node B (i.e., node D1)) of the second p-channel transistor PFET P1 to the voltage supply 405 via a second capacitor C1. A differential voltage (Vcomp) input at the comparator 480 is based on the node A (voltage) at the first input and the node B (voltage) at the second input.

During phase 1, the first switch S0 is selectively closed to connect the drain (node D0) of the first p-channel transistor PFET P0 to the voltage supply 405 via the first capacitor C0, such that the first reference cell current (IrefA) corresponding to the first reference cell A 415A flows through the first n-channel transistor NFET N0. Also, during the phase 1, the second switch S1 is selectively closed to connect the drain (node D1) of the second p-channel transistor PFET P1 to the voltage supply 405 via the second capacitor C1, such that a data cell current (Idata) corresponding to the data cell 410 flows through the second n-channel transistor NFET N1.

During phase 2, the first switch S0 is selectively opened to disconnect the drain (node D0) of the first p-channel transistor PFET P0 from the voltage supply 405, such that the data cell current (Idata) corresponding to the data cell flows through the first n-channel transistor. During the phase 2, the second switch S1 is selectively opened to disconnect the drain (node D1) of the second p-channel transistor PFET P1 from the voltage supply 405, such that a second reference cell current (IrefB) corresponding to the second reference cell flows through the second n-channel transistor NFET N1. The node A voltage at the node A (node D0) is based on the first reference cell current minus the data cell current (e.g., IrefA-Idata). The node B voltage at the node B (node D1) is based on the data cell current minus the second reference cell current (e.g., Idata-IrefB).

The differential voltage input at the comparator 480 is a difference between the node B voltage and the node A voltage.

During the phase 1, the multiplexer 420 is configured to selectively connect the first reference cell A 415A to the first n-channel transistor NFET N0, thereby causing the first reference cell current (IrefA) to flow down through first n-channel transistor NFET N0. Also, during the phase 1, the multiplexer 420 is configured to selectively connect the data cell 410 to the second n-channel transistor NFET N1, thereby causing the data cell current (Idata) to flow down through the second n-channel transistor NFET N1.

During the phase 2, the multiplexer 420 is configured to selectively connect the data cell 410 to the first n-channel transistor NFET N0, thereby causing the data cell current (Idata) to flow down through the first n-channel transistor NFET N0. Also, during the phase 2, the multiplexer 420 is configured to selectively connect the second reference cell B 415B to the second n-channel transistor NFET N1, thereby causing the second reference cell current (IrefB) to flow down through the second re-channel transistor NFET N1.

Figure 9:
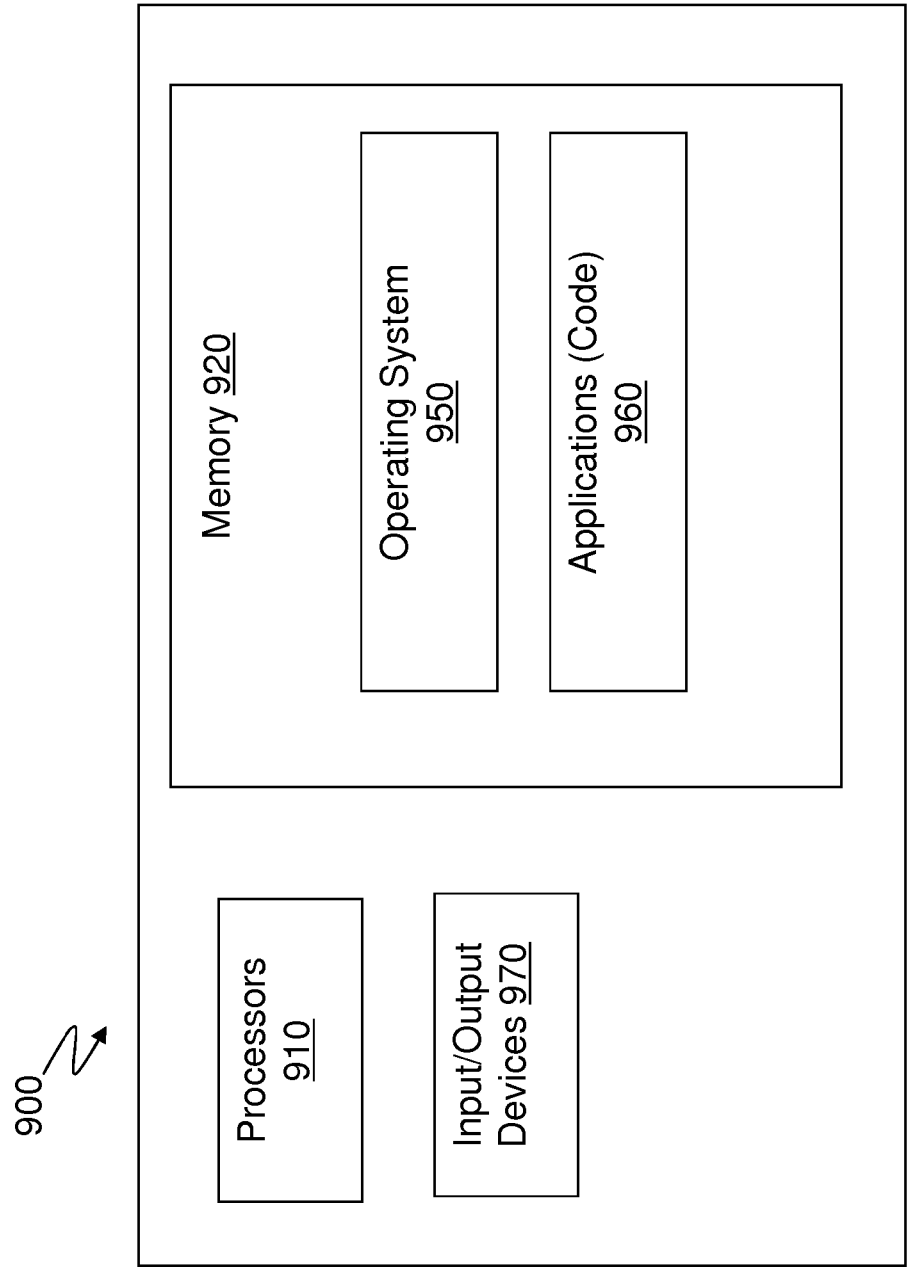
FIG. 9 illustrates an example of a computer having capabilities, which may be included and utilized in embodiments.

FIG. 9 illustrates an example of a computer 900 having capabilities, which may be included in exemplary embodiments. Various methods, procedures, modules, flow diagrams, tools, applications, circuits, elements, and techniques discussed herein may also incorporate and/or utilize the capabilities of the computer 900. Moreover, capabilities of the computer 900 may be utilized to implement features of exemplary embodiments discussed herein. One or more of the capabilities of the computer 900 may be utilized to implement, incorporate, to connect to, and/or to support any element discussed herein (as understood by one skilled in the art) in FIGS. 4-8.

Generally, in terms of hardware architecture, the computer 900 may include one or more processors 910, computer readable storage memory 920, and one or more input and/or output (I/O) devices 970 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 910 is a hardware device for executing software that can be stored in the memory 920. The processor 910 can be virtually any custom made or commercially available processor, a central processing unit (CPU), a data signal processor (DSP), or an auxiliary processor among several processors associated with the computer 900, and the processor 910 may be a semiconductor based microprocessor (in the form of a microchip) or a microprocessor. Note that the memory 920 can have a distributed architecture, where various components are situated remote from one another, but can be accessed by the processor 910.

The software in the computer readable memory 920 may include one or more separate programs, each of which comprises an ordered listing of executable instructions for implementing logical functions. The software in the memory 920 includes a suitable operating system (O/S) 950 and one or more applications 960 of the exemplary embodiments. As illustrated, the application 960 comprises numerous functional components for implementing the features, processes, methods, functions, and operations of the exemplary embodiments. The application 960 of the computer 900 may represent numerous applications, agents, software components, modules, interfaces, controllers, etc., as discussed herein but the application 960 is not meant to be a limitation.

The operating system 950 may control the execution of other computer programs, and provides scheduling, input-output control, file and data management, memory management, and communication control and related services.

The application 960 may be a source program, executable program (object code), script, or any other entity comprising a set of instructions to be performed. When a source program, then the program is usually translated via a compiler, assembler, interpreter, or the like, which may or may not be included within the memory 920, so as to operate properly in connection with the O/S 950. Furthermore, the application 960 can be written as (a) an object oriented programming language, which has classes of data and methods, or (b) a procedure programming language, which has routines, subroutines, and/or functions.

The I/O devices 970 may include input devices (or peripherals) such as, for example but not limited to, a mouse, keyboard, scanner, microphone, camera, etc. Furthermore, the I/O devices 970 may also include output devices (or peripherals), for example but not limited to, a printer, display, etc. Finally, the I/O devices 970 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 970 also include components for communicating over various networks, such as the Internet or an intranet. The I/O devices 970 may be connected to and/or communicate with the processor 910 utilizing Bluetooth connections and cables (via, e.g., Universal Serial Bus (USB) ports, serial ports, parallel ports, FireWire, HDMI (High-Definition Multimedia Interface), PCIe, InfiniBand®, or proprietary interfaces, etc.).

When the computer 900 is in operation, the processor 910 is configured to execute software stored within the memory 920, to communicate data to and from the memory 920, and to generally control operations of the computer 900 pursuant to the software. The application 960 and the O/S 950 are read, in whole or in part, by the processor 910, perhaps buffered within the processor 910, and then executed.

When the application 960 is implemented in software it should be noted that the application 960 can be stored on virtually any computer readable storage medium for use by or in connection with any computer related system or method.

The application 960 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 960 is implemented in hardware, the application 960 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 900 includes non-limiting examples of software and hardware components that may be included in various devices, servers, and systems discussed herein, and it is understood that additional software and hardware components may be included in the various devices and systems discussed in exemplary embodiments.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

It will be understood that those skilled in the art, both now and in the future, may make various improvements and enhancements which fall within the scope of the claims which follow.

What is claimed is:

1. A method for sensing a data state of a data cell, the method comprising:
    providing a comparator having a first input at a node A and a second input at a node B, an output of the comparator being based on the node A and the node B;
    providing a first n-channel transistor connected to a first p-channel transistor at the node A;
    providing a second n-channel transistor connected to a second p-channel transistor at the node B;
    providing a first switch connected to a gate and a drain of the first p-channel transistor, wherein the first switch is configured to selectively connect the drain of the first p-channel transistor to a voltage supply via a first capacitor;
    providing a second switch connected to a gate and a drain of the second p-channel transistor, wherein the second switch is configured to selectively connect the drain of the second p-channel transistor to the voltage supply via a second capacitor;
    configuring a multiplexer to selectively connect a first reference cell or the data cell to the first n-channel transistor; and
    configuring the multiplexer to selectively connect the data cell or a second reference cell to the second n-channel transistor;
    wherein the comparator outputs the data state of the data cell based on input of a node A voltage at the node A and a node B voltage at the node B.

2. The method of claim 1, wherein a column decoder connects the multiplexer to the first reference cell, the second reference cell, and the data cell.

3. The method of claim 1, wherein a voltage supply is connected to the first p-channel transistor and the second p-channel transistor.

4. The method of claim 1, wherein a differential voltage input at the comparator is based on the node A at the first input and the node B at the second input.

5. The method of claim 4, wherein, during phase 1, the first switch is selectively closed to connect the drain of the first p-channel transistor to the voltage supply via the first capacitor, such that a first reference cell current corresponding to the first reference cell flows through the first n-channel transistor.

6. The method of claim 5, wherein, during the phase 1, the second switch is selectively closed to connect the drain of the second p-channel transistor to the voltage supply via the second capacitor, such that a data cell current corresponding to the data cell flows through the second n-channel transistor.

7. The method of claim 6, wherein, during phase 2, the first switch is selectively opened to disconnect the drain of the first p-channel transistor from the voltage supply, such that the data cell current corresponding to the data cell flows through the first n-channel transistor.

8. The method of claim 7, wherein, during the phase 2, the second switch is selectively opened to disconnect the drain of the second p-channel transistor from the voltage supply, such that a second reference cell current corresponding to the second reference cell flows through the second n-channel transistor.

9. A method for sensing a data state of a data cell, the method comprising:

providing a node A voltage at a node A, such that the node A voltage is based on a first reference cell current minus a data cell current; and providing a node B voltage at a node B, such that the node B voltage is based on the data cell current minus a second reference cell current;

wherein a comparator has a first input at the node A and a second input at the node B;

wherein, at the node A, a first n-channel transistor is connected to a first p-channel transistor;

wherein, at the node B, a second n-channel transistor is connected to a second p-channel transistor;

a first switch connected to a gate and a drain of the first p-channel transistor, wherein the first switch is configured to selectively connect the drain of the first p-channel transistor to a voltage supply via a first capacitor;

a second switch connected to a gate and a drain of the second p-channel transistor, wherein the second switch is configured to selectively connect the drain of the second p-channel transistor to the voltage supply via a second capacitor;

wherein a multiplexer is configured to selectively connect a first reference cell or the data cell to the first n-channel transistor and configured to selectively connect the data cell or a second reference cell to the second n-channel transistor;

wherein the comparator outputs the data state of the data cell based on a differential voltage between the node A voltage and the node B voltage.

* * * * *